United States Patent
Harada et al.

(10) Patent No.: US 6,436,761 B1
(45) Date of Patent: Aug. 20, 2002

(54) METHOD FOR MANUFACTURING SEMICONDUCTOR MEMORY DEVICES

(75) Inventors: Yoshihiro Harada; Nobuyuki Yamanishi, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/658,986

(22) Filed: Sep. 11, 2000

(30) Foreign Application Priority Data

Sep. 10, 1999 (JP) .......................................... 11-257881

(51) Int. Cl.⁷ .......................................... H01L 21/8242
(52) U.S. Cl. ..................... 438/253; 438/225; 438/396; 438/398
(58) Field of Search ................................ 438/253, 254, 438/255, 256, 396, 397, 398

(56) References Cited

U.S. PATENT DOCUMENTS 5,352,623 A  * 10/1994  Kamiyama .................. 438/253

6,218,260 B1 *  4/2001  Lee et al. .................... 438/398

FOREIGN PATENT DOCUMENTS

| JP | 8-264732 | 10/1996 |
| JP | 10-275901 | 10/1998 |
| JP | 11-68060 | 3/1999 |
| JP | 11-145425 | 5/1999 |
| JP | 11-150249 | 6/1999 |
| JP | 11-177031 | 7/1999 |
| JP | 11-233735 | 8/1999 |

* cited by examiner

Primary Examiner—Charles Bowers
Assistant Examiner—Jack Chen
(74) Attorney, Agent, or Firm—McGinn & Gibb, PLLC

(57) ABSTRACT

There is provided a method for manufacturing semiconductor memory devices includes the steps of; forming, for example, an N-type MOS transistor as a memory-cell selecting transistor on a P-type silicon substrate beforehand; forming, as a capacitive-element manufacturing step, an HSG on a first amorphous silicon film which provides a lower electrode; and diffusing an impurity into this HSG and then removing a surface layer of the HSG.

9 Claims, 14 Drawing Sheets

19; capacitive insulator film (silicon nitride film)
16a; HSG
A
17

19
16a
A

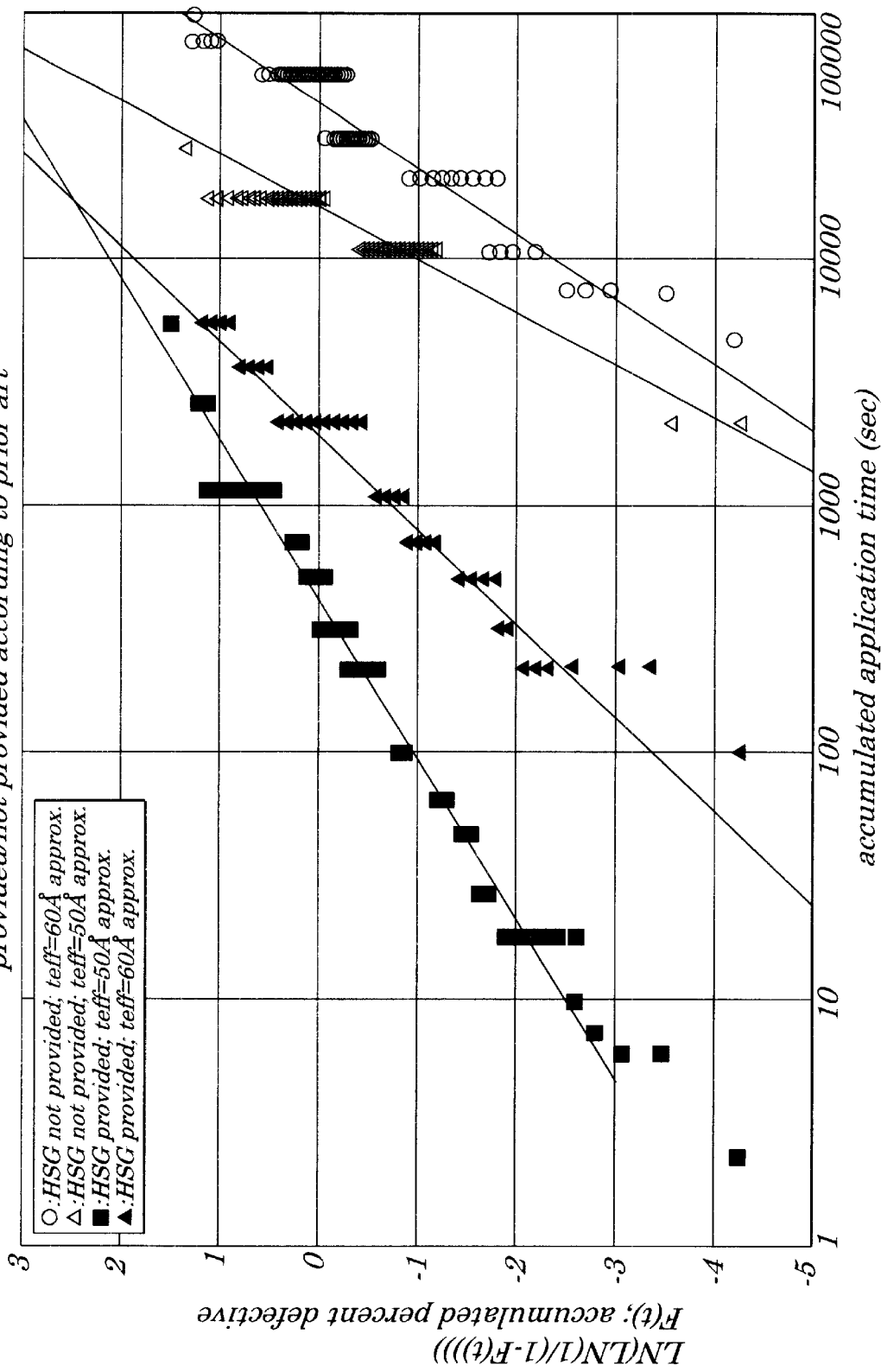
FIG.13 (PRIOR ART) TDDB properties, difference due to HSG provided/not provided according to prior art

METHOD FOR MANUFACTURING SEMICONDUCTOR MEMORY DEVICES

BACKGROUND OF THE INVENTION

1. Field of the Invention

The invention relates to a method for manufacturing semiconductor memory devices and, more particularly, to a method for manufacturing semiconductor memory devices which each store therein information utilizing a capacitive element having an HSG (Hemispherical Grain) structure.

2. Description of the Related Art

Semiconductor memory devices (memories) are roughly classified into DRAMs (Dynamic Random Access Memories) and SRAMs (Static Random Access Memories), most of which are comprised of MOS (Metal Oxide Semiconductor) transistors excellent in integration density. Further, a DRAM can enjoy the above-mentioned advantage of high integration density more than an SRAM, to lower costs, thus finding a wide application field of various memory apparatuses including information equipment.

Also, since the DRAM utilizes capacitive elements to store information based on existence/nonexistence of charge in each of capacitive elements, it is necessary to limit a resultantly large area due to increasing integration density which area is occupied by these capacitive elements on its semiconductor substrate; with this, to compensate for a resultant decrease in capacitance of each capacitive element, various techniques have been worked out in terms of structure of the capacitive elements.

With this, the DRAM includes a switching transistor (memory-cell selecting transistor) consisting of the above-mentioned MOS transistor for controlling inputting/outputting of information to its capacitive elements, in such a configuration that that memory-cell selecting transistor and one such capacitive element may make up a one-bit memory cell. Each capacitive element is connected to either a source of a drain of the MOS transistor of each memory-cell selecting transistor, so that information read/write operations are performed to the capacitive element when a word-line signal is applied to a gate electrode of that MOS transistor to turn it ON or OFF.

Since the capacitive elements are reduced in size with improvements in integration density and fine patterning of DRAMs, an appropriate method must be developed to increase the capacitance of each of the capacitive elements. In an attempt to do so, one method is provided for increasing surface area of capacitive insulator film of each capacitive element. Another method is provided for reducing film thickness of the capacitive insulator film. Conventionally, the above-mentioned HSG technology has been employed. This HSG technology attempts to form an HSG on a surface of a lower electrode of each capacitive element, to thereby increase the surface area of the capacitive insulator film.

As shown in FIG. 14, for example, on a P-type silicon substrate 51 of a DRAM, N-type source region 52 and N-type drain region 53, a gate insulator film 54, and a gate electrode 55 are formed in a region isolated by an element-isolating insulator film 57, thus forming an N-type MOS transistor 56 as the memory-cell selecting transistor. The gate electrode 55 here is connected to a word line and a source electrode (not shown), to a bit line. Also, so as to cover a whole surface, a first inter-layer insulator film 58 and a second inter-layer insulator film 62 are formed, in such a configuration that the first inter-layer insulator film 58 has a first contact hole 59 formed therein, in which first contact hole 59 is so formed a contact plug 60 as to be connected to the N-type drain region 53 and also the second inter-layer insulator film 62 has a second contact hole 63 formed therein, in which second contact hole 63 is so formed a capacitive element 70 as to be connected to the contact plug 60.

Thus, the capacitive element 70 is provided with a lower electrode 71, a capacitive insulator film 72, and an upper electrode 73. The lower electrode 71 has an HSG 74 formed by HSG technology thereon. Also, the lower electrode 71 has an impurity diffused therein to prevent lowering of its capacitance due to its own depletion and has a barrier film 75 formed thereon to prevent the impurity from being diffused to outside.

With this, after the capacitive insulator film 72 is formed on the barrier film 75, this capacitive element 70 needs to undergo oxidation processing (annealing) to suppress a leakage current and an initial failure rate caused by being a capacitive element. Conventionally, this oxidation has been performed using an FA (Furnace Anneal) processing at about 800° C. which uses a diffusion furnace as its heating source.

Recently, on the other hand, with progress in the semiconductor processing technologies, a semiconductor device, such as a processor and a like, having a large-scale logic part and DRAM part mixed on a same semiconductor substrate has been developed. To improve the operation speed of such the semiconductor device, such a device region as constituting the logic part, in particular, needs to undergo a suicide process, so that the above-mentioned device requires for its manufacturing a lowered processing temperature, that is, so-called low-temperature processes.

The prior-art method for manufacturing the semiconductor device, however, suffers from the following problems.

A first problem is that although the capacitive element can be increased in capacitance by employing the HSG technology, its service life is degraded as compared to those manufactured without using the HSG technology. The reasons for this problem are described below with reference to FIGS. 12A and 12B.

As shown in FIG. 12A, when the lower electrode 71 has an HSG 71a formed thereon, this HSG 71a in turn has a sharp constriction 71b formed at its root. This remarkably damages coverage of the capacitive insulator film 72 formed above the lower electrode 71, thus reducing a film thickness T of a part of the capacitive insulator film 72 as shown enlarged in FIG. 12B which part is formed near that constriction 71b and its vicinity portion A. Therefore, an electric field is concentrated during operation to the above-mentioned part of the capacitive insulator film 72 having a small film thickness T at the constriction 71b, to cause a leakage current to flow from that portion, thus degrading the service life of the capacitive element. Specifically, its service life is shortened by roughly one digit as compared to a capacitive element having no HSG formed thereon. With this, it needs to be improved so as to enjoy a service life almost equivalent to that of the capacitive element having no HSG formed thereon.

A second problem is that when the capacitive insulator film is decreased in film thickness to increase the capacitance of the capacitive element, larger thermal stress is applied which is generated by oxidation performed after that capacitive insulator film is formed, thus increasing occurrence of initial failure rates.

That is, as mentioned above, after the capacitive insulator film is formed, for example to reduce the leakage current and the initial failure rate due to being a capacitive element, oxidation is required by use of, for example, the above-mentioned FA processing, in which case, however, influence of the thermal stress applied during this oxidation process cannot be avoided if processing temperature is high. To reduces this influence, the oxidation process must be performed at a lower temperature, but if the temperature is lowered too much, an essential object cannot achieved by the oxidation process. Therefore, the thermal stress must be suppressed to thereby reduce the initial failure rate.

FIG. 13 is plotted in terms of a TDDB (Time Dependent Dielectric Breakdown) property. As can be seen from the FIG.13, formation of the HSG degrades the service life and the reduction in a film thickness Teff (film thickness, calculated as oxide film thickness) of the capacitive insulator film further degrades the capacitive element.

A third problem is that processing for preventing depletion of a capacitive element, which is required by a temperature-lowering process, is effective for that purpose by diffusing the impurity employed but not in improvement of the service life.

That is, when the temperature-lowering process is performed, depletion due to a lowered temperature develops at the capacitive element, thus decreasing its capacitance. To prevent this effectively, after the lower electrode is formed, the capacitive element can undergo annealing in an atmosphere of a phosphine gas to diffuse phosphorus into the lower electrode, which is followed by light etching of the surface of the lower electrode. If, however, the insulator film and the upper electrode are formed afterward to complete the capacitive element, the influence due to the lowered temperature remains as is, thus unavoidably degrading the service life.

As mentioned above, the prior-art method for manufacturing the semiconductor memory device has the above-mentioned first through third problems and so cannot improve the service life of the capacitive element nor reduce the initial failure rate, thus finding it difficult to improve reliability of the capacitive element.

SUMMARY OF THE INVENTION

In view of the above, it is an object of the invention to provide a method for manufacturing semiconductor memory devices that can prolong service life and also reduce initial failure rate of a capacitive element having an HSG structure, thus improving reliability.

According to an aspect of the present invention, there is provided a method for manufacturing semiconductor memory devices by forming a memory-cell selecting transistor on a semiconductor substrate and then forming a capacitive element so as to be connected to one operating region of the memory-cell selecting transistor, including the steps of:

forming, as an inter-layer insulator-film forming process, the memory-cell selecting transistor on the semiconductor substrate and then forming an inter-layer insulator film on the semiconductor substrate;

forming, as a lower-electrode forming process, a contact hole in the inter-layer insulator film and then forming a lower electrode of the capacitive element so as to be connected to one operating region of the memory-cell selecting transistor;

forming, as a capacitive-insulator-film forming process, a capacitive insulator film of the capacitive element above the lower electrode;

oxidizing, as an oxidation process, the semi-conductor substrate in a furnace at a temperature of 700–780° C. for a time of 30–50 minutes; and forming, as an upper-electrode forming process, an upper electrode of the capacitive element above the capacitive insulator film.

In the foregoing, a preferable mode is one wherein the lower-electrode forming process includes the steps of: forming, as a first step, a first amorphous silicon film in the contact hole in the inter-layer insulator film; forming, as a second step, a second amorphous silicon film containing microcrystal above the first amorphous silicon film, to form an HSG by using as a nucleus the microcrystal contained in the second amorphous silicon film; diffusing, as a third step, an impurity into an HSGl; and removing, as a fourth step, a surface layer of the HSG.

Also, a preferable mode is one wherein the lower-electrode forming process includes the steps of: forming, as a first step, a first amorphous silicon film in the contact hole in the inter-layer insulator film; forming, as a second step, a second amorphous silicon film containing microcrystal on a surface of the first amorphous silicon film, to form the HSG by using as the nucleus the microcrystal contained in the second amorphous silicon film; and removing, following the second step, a surface layer of the HSG as a third step.

Also, a preferable mode is one wherein by the third step, the phosphine (PH$_3$) gas is introduced into the reactive apparatus to perform annealing at a temperature of 500–780° C. at a pressure of 5–400 Torr, thus diffusing phosphorus into the HSG.

Also, a preferable mode is one wherein by the third step, a phosphine gas is introduced into a reactive apparatus to start diffusion of phosphorus into the HSG in order to perform annealing for a predetermined time, and then, with the introduction of the phosphine gas as continued, the temperature of the annealing is lowered.

Also, a preferable mode is one wherein the fourth step is followed by a fifth step of removing a chemical oxide film formed on the HSG surface.

Furthermore, a preferable mode is one wherein the fifth step involves processing by use of an etchant having a selection ratio between a material of the HSG or the lower electrode and the chemical oxide film.

With the above aspect, after the HSG is formed, its surface layer can be removed to round off a shape of the HSG constriction, thus suppressing concentration of an electric field for improvements in the service life and depletion. Also, after the HSG is formed, an impurity can be diffused to improve the service life and the depletion. Also, after the capacitive insulator film is formed, the oxidation processing can be performed in a wet oxidation atmosphere inside the furnace at a relatively low temperature for a relatively long time, to relax thermal stress on the capacitive insulator film, thus reducing the initial failure rate.

Accordingly, reliability of the capacitive element having an HSG structure can be improved by prolonging its service life and reducing its initial failure rate.

BRIEF DESCRIPTION OF THE DRAWINGS

The above and other objects, advantages and features of the present invention will be more apparent from the following description taken in conjunction with the accompanying drawings in which:

FIG. 13 is a graph indicating a relationship between an accumulated percent defective (vertical axis) and an accumulated application time lapse (horizontal axis) explaining that reliability of a capacitive element degrades with a difference in a film thickness of capacitive element caused by existence/nonexistence of an HSG as well as by a difference in a film thickness of the capacitive element, obtained by the prior-art method for manufacturing semiconductor memory devices.

DESCRIPTION OF THE PREFERRED EMBODIMENTS

The following will describe embodiments of the invention with reference to the drawings. The description is made specifically with reference to the embodiment.

First Embodiment

A method for manufacturing semiconductor memory devices according to a first embodiment is described below with reference to FIGS. 1–4 in an order of processes performed.

Figure 1A:
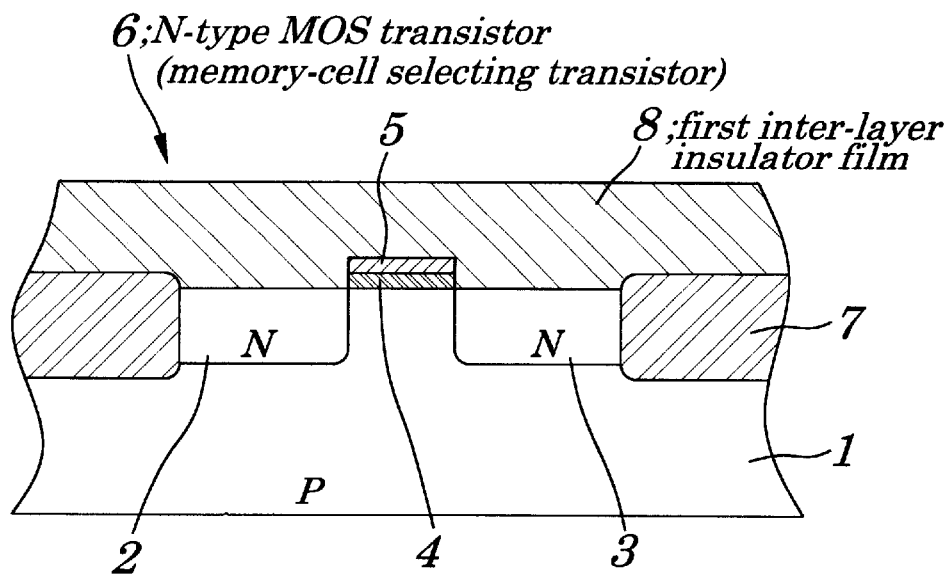
FIGS. 1A and 1B are flow diagrams indicating a method according to a first embodiment of the present invention for manufacturing semiconductor memory devices, in an order of processes performed.

First, as shown in FIG. 1A, for example, in a region isolated by an element-isolation insulator film 7 on a P-type silicon substrate 1 are formed by a known method an N-type source region 2, an N-type drain region 3, a gate insulator film 4, and a gate electrode 5 to thus make up an N-type MOS transistor 6 which selects a memory cell. Each N-type MOS transistor 6 is paired with a later-mentioned capacitive element to make up one memory cell. For simplification of description, only one N-type MOS transistor 6 is shown. Next, a CVD (Chemical Vapor deposition) method or a like is used to form a first inter-layer insulator film 8 such as a silicon oxide film so as to cover a whole surface.

Figure 1B:
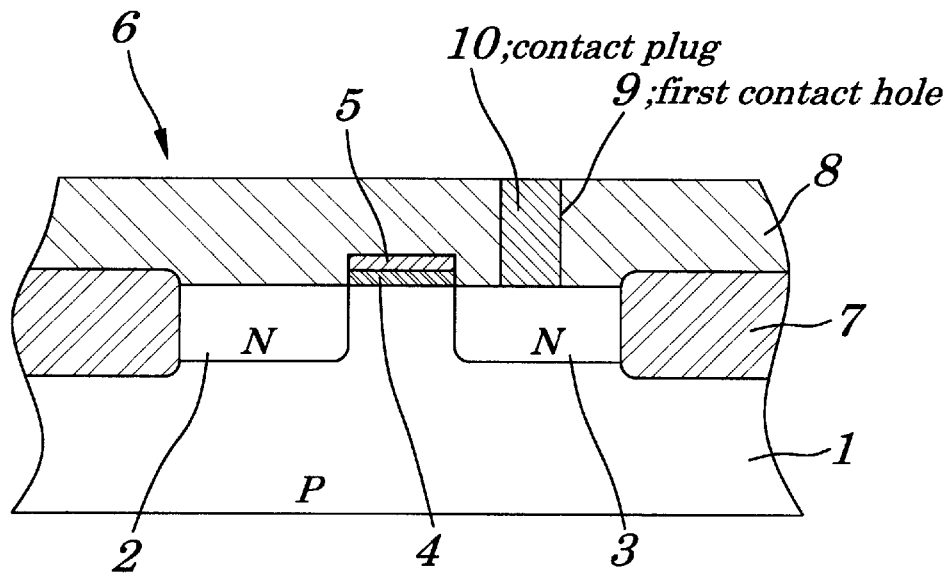

Next, as shown in FIG. 1B, a photolithography method is used to form a first contact hole 9 in the first inter-layer insulator film 8 above the N-type drain region 3 (or the N-type source region 2) of the N-type MOS transistor 6 and then the CVD method or the like is used to dope an impurity such as phosphorus (P) onto the whole surface including the first contact hole 9, thus forming a conductive film such as a poly-silicon film. Next, a CMP method or the like is used to remove necessary regions other than inside of the first contact hole 9 in this conductive film, to form a contact plug 10 in the first contact hole 9.

Figure 2C:
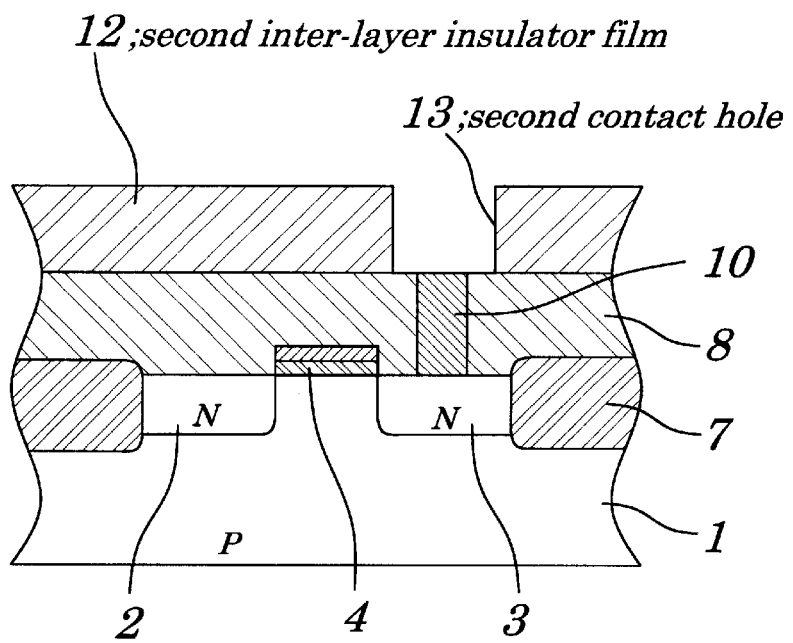
FIGS. 2C and 2D are continued flow diagrams indicating a same method for manufacturing semiconductor memory devices as above, in the order of processes performed.

Next, as shown in FIG. 2C, the CVD method or the like is used to form a second inter-layer insulator film 12 so as to cover the whole surface and then the photolithography method is used to form a second contact hole 13 in the second inter-layer insulator film 12. Next, a capacitive element is formed in the second contact hole 13. The following will describe in detail a method for manufacturing this capacitive element with reference also to a flowchart of FIG. 5.

Figure 2D:
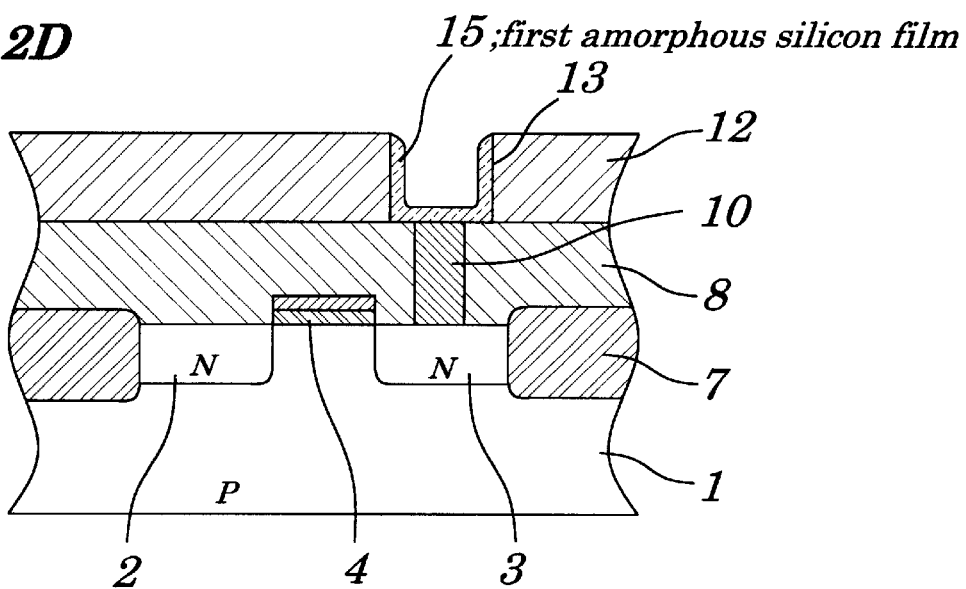

Following the process of FIG. 2C, the CVD method or the like is used to dope an impurity such as phosphorus at a concentration of about $1 \times 10^{20}/cm^3$ onto the whole surface including the second contact hole 13, to form a first amorphous silicon film 15 (step S10). Next, as shown in FIG. 2D, a dry etching method or a like is used to remove necessary regions other than the inside of the second contact hole 13 in this first amorphous silicon film 15, to leave the first amorphous silicon film 15 only inside the second contact hole 13. Next, it is washed with an etchant such as a hydrofluoric acid diluted with water, to remove unnecessary regions such as natural oxide films formed on the surface of the first amorphous silicon film 15.

Figure 3E:
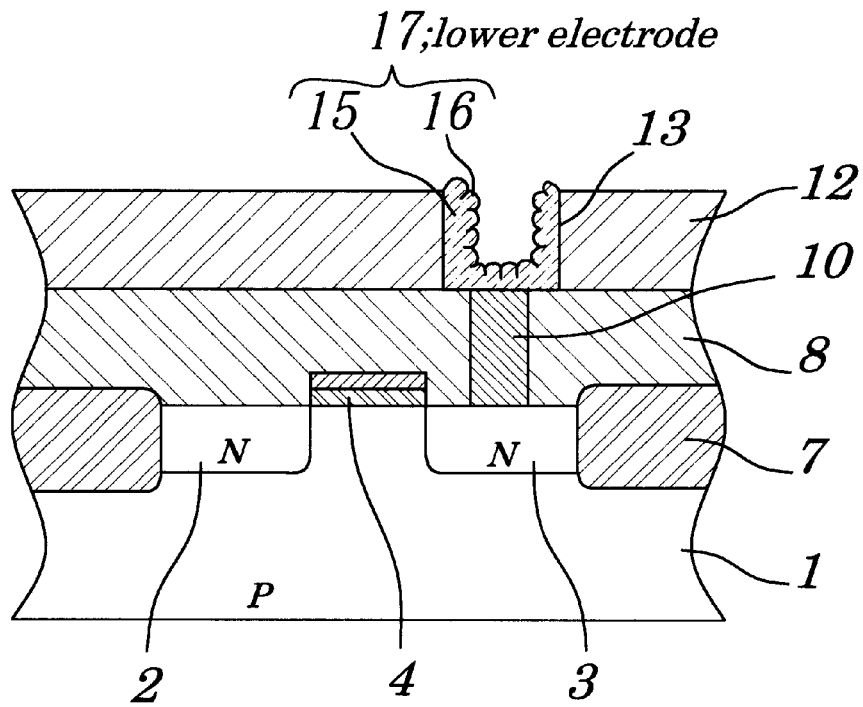
FIGS. 3E and 3F are further continued flow diagrams indicating the same method for manufacturing semiconductor memory devices as above, in the order of processes performed.

Next, as shown in FIG. 3E, a second amorphous silicon film containing microcrystal is formed on the first amorphous silicon film 15 to nucleate an HSG, thus forming an HSG 16 using as a nucleus the microcrystal contained in the second amorphous silicon film (step S11). With this, a lower electrode 17 is formed. Next, this lower electrode 17 is annealed in an atmosphere of, for example, a phosphine ($PH_3$) gas introduced, to diffuse phosphorus as an impurity into the HSG 16 in order to prevent the lower electrode 17 from being depleted (step S12).

The above-mentioned series of the processes of the HSG nucleation through the impurity diffusion is thoroughly performed in a CVD apparatus (furnace) having a load lock capable of evacuation, that is, performed in an in-situ approach.

First, with partial pressure of moisture and oxygen in the CVD apparatus set at about $1 \times 10^{-6}$ Torr or lower, a silicon substrate 1 is put in the furnace at time t0, after which the temperature in the furnace is raised to a relatively low temperature of 550–600° C. by time t1. During this rise in temperature, partial pressure of moisture and oxygen in the furnace is kept at the above-mentioned relatively low temperature, so that oxidation of the surface of the first amorphous silicon film 15 is suppressed. Next, the pressure in the furnace is set at about $1×10^{-3}$ Torr or lower and then, while the time elapses from time t1 when the temperature is stabilized to time t2, a silane ($SiH_4$) gas is introduced into the furnace at a rate of 50–80 sccm (standard cubic centimeters per minute): for about 20 minutes, to introduce as the HSG nucleus the second amorphous silicon film containing microcrystal onto the first amorphous silicon film 15 for about 20 minutes and then anneal it in a high vacuum, thus forming the HSG 16 (step S11).

Next, the pressure in the furnace is set at about 5–400 Torr and then, while the time elapses from time t3 to time t4, a phosphine gas is introduced into the furnace at a rate of 150–500 sccm for 10–120 minutes for annealing. With this, phosphorus is diffused into the HGS 16 (step S12). Next, during a time lapse of time t4 to time t5, the temperature in the furnace is lowered gradually, for which time lapse the introduction of the phosphine gas is continued. Then, with the temperature in the furnace as kept constant for a time lapse of time t5 to time t6, the furnace is purged of a residual gas left therein and, during a time lapse of time t6 to time t7, the P-type silicon substrate 1 is taken out of the furnace. By the above-mentioned series of processes, the lower electrode 17 is formed having the HSG structure including the first amorphous silicon film 15 and the HSG 16 formed thereon.

Figure 6:
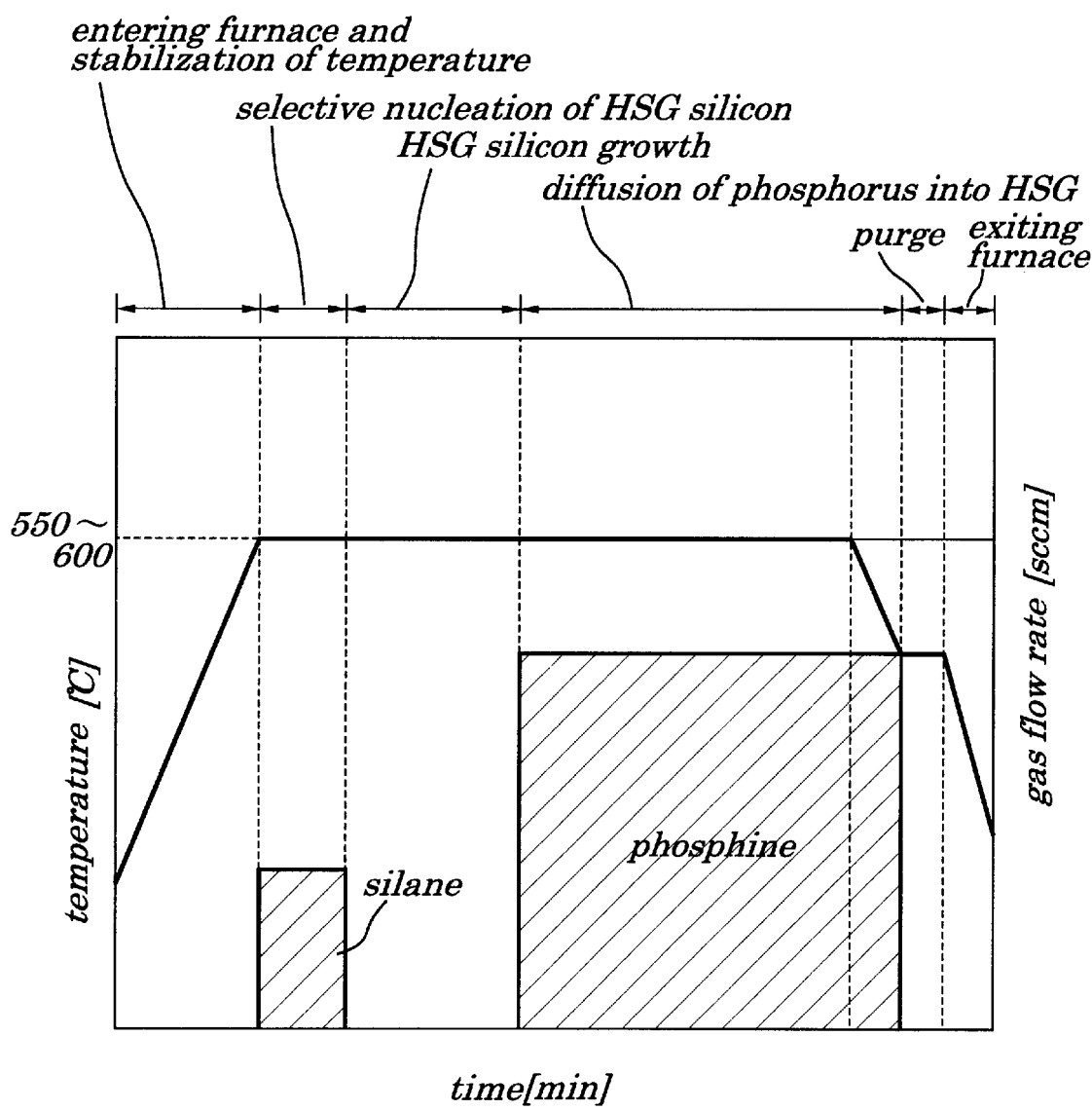
FIG. 6 is a timing chart indicating the main processes of the same method for manufacturing semiconductor memory devices as above.

Since by the above-mentioned method of diffusing an impurity, as can be seen from a timing chart of FIG. 6, during the time lapse of t4 to t5, the temperature in the furnace is gradually lowered while the introduction of the phosphine gas is continued, the phosphorus diffused into the HSG 16 is difficult to escape to outside therefrom, so that the impurity concentration in the HSG 16 can be kept at a high level. With this, it is possible to further improve the service life of the lower electrode 17 as well as effects of preventing capacitance from lowering due to, depletion thereof.

The temperature for phosphorus diffusion is not limited to the above-mentioned value of 550–600° C. but may be within a range of 500–780° C. for achieving sufficient effects.

Next, after the silicon substrate 1 is taken out of the furnace, a mixed solution of ammonia and hydrogen peroxide is used to etch the HSG surface of the lower electrode 17, thus removing high-impurity-concentration regions (step S13).

Figure 10A:
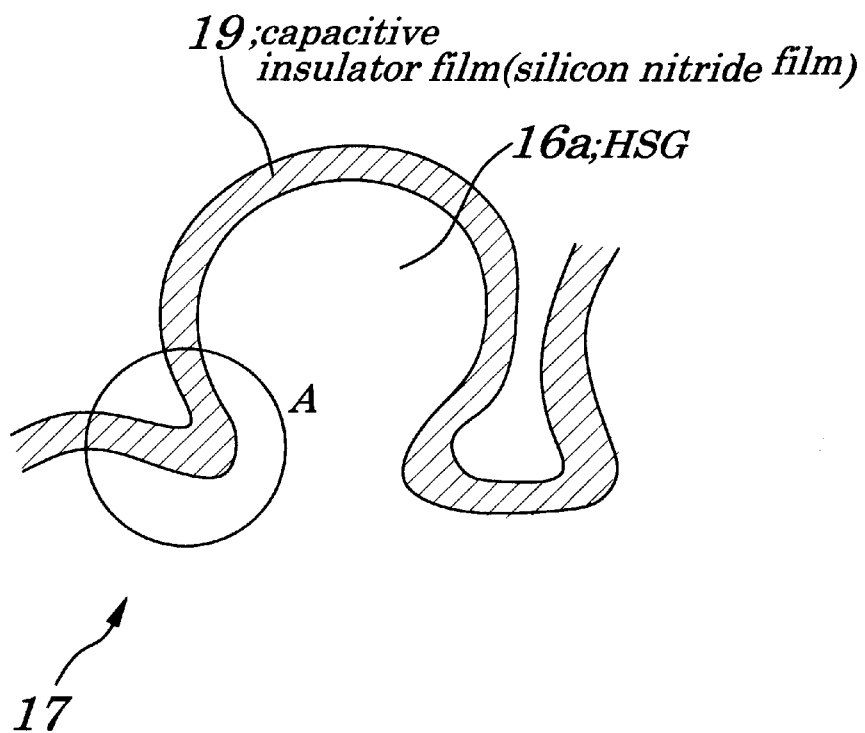
FIGS. 10A and 10B illustrations explaining effects by a light etching process in the same method for manufacturing semiconductor memory devices as above.
Figure 10B:
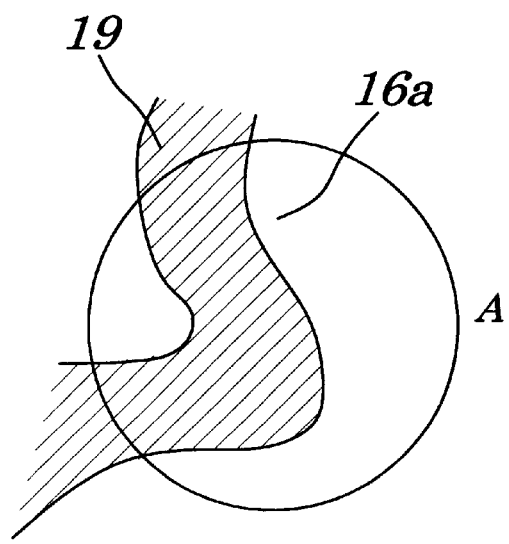
Figure 12A:
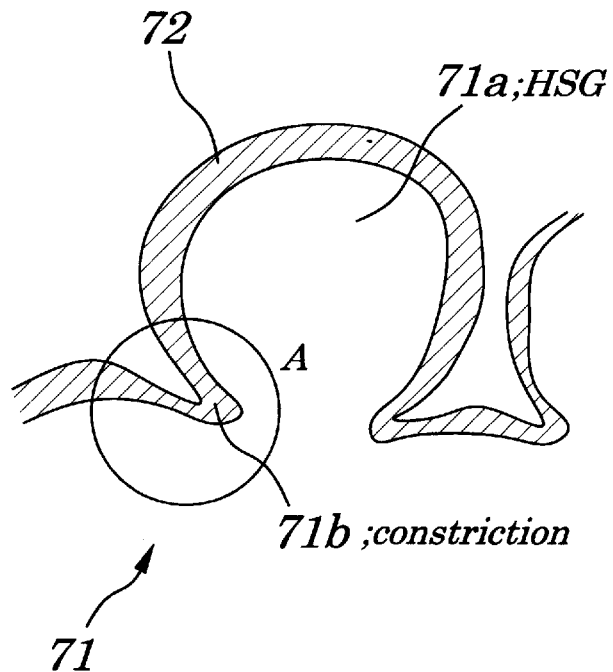
FIGS. 12A and 12B are illustrations explaining a defect of a prior-art method for manufacturing semi-conductor memory devices.
Figure 12B:
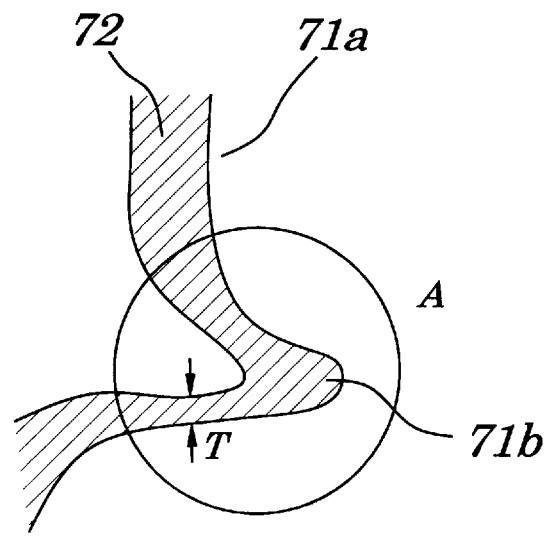

Thus, by removing the high-impurity-concentration regions formed on the HSG surface, a portion corresponding to constriction 71b at a root of HSG 71a subject to a concentrated electric field shown in FIGS. 12A and 12B according to prior art can be etched as shown in FIGS. 10A and 10B, thus rounding off a shape of the HSG 16. With this, a capacitive insulator film 19 formed subsequently on the lower electrode 17 is improved in coverage. Therefore, electric field is not concentrated to only one part of the HSG 16 during operation, to prevent a leakage current from flowing, thus improving the service life of the capacitive element.

Next, a chemical oxide film formed after the light etching is removed with a hydrofluoric acid diluted with purified water or a like (step S14). With this, effective capacitance can be increased.

Figure 11A:
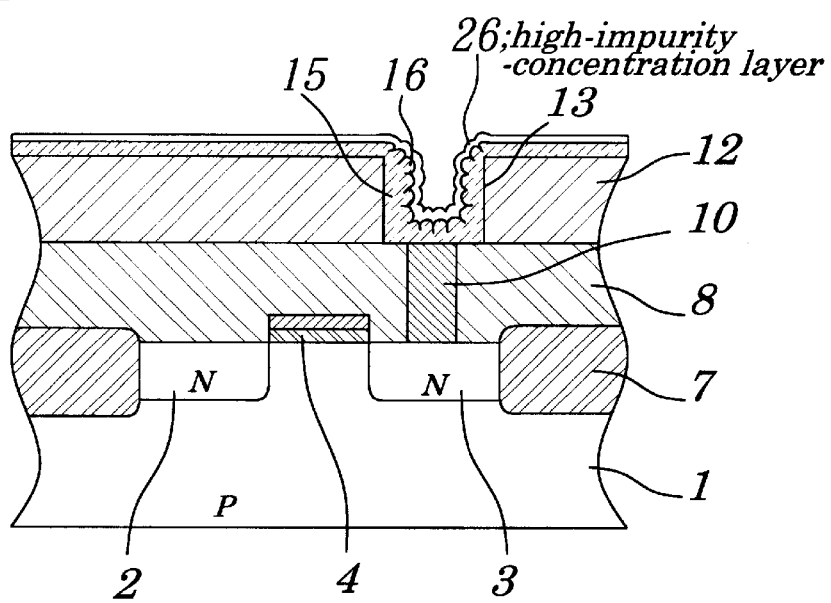
FIGS. 11A, 11B and 11C are flow diagrams for explaining actions of the main processes of the method for manufacturing semiconductor memory devices according to the invention.
Figure 11B:
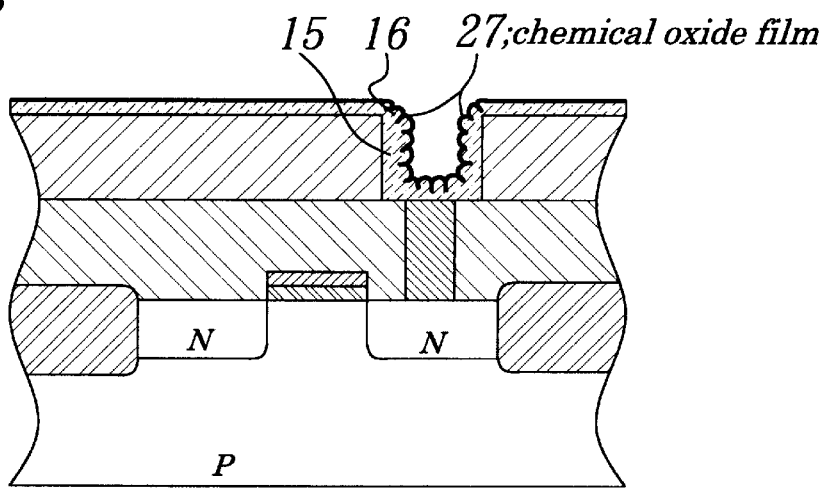

As shown in FIG. 11A, after phosphine is annealed, a high-impurity-concentration layer 26 made of phosphorus is formed on the whole surface including the HSG 16. Next, the surface of the HSG 16 undergoes light etching by use of a mixed solution of, for example, ammonium hydroxide ($NH_4OH$) and hydrogen peroxide ($H_2O_2$), to remove the high-impurity-concentration layer 26. During this light etching, as shown in FIG. 11B, an unnecessary chemical oxide film 27 is formed on the HSG surface. Such a chemical oxide film 27, if any, acts as part of a capacitive insulator film formed subsequently, thus contributing to lowering of the capacitance.

Figure 11C:
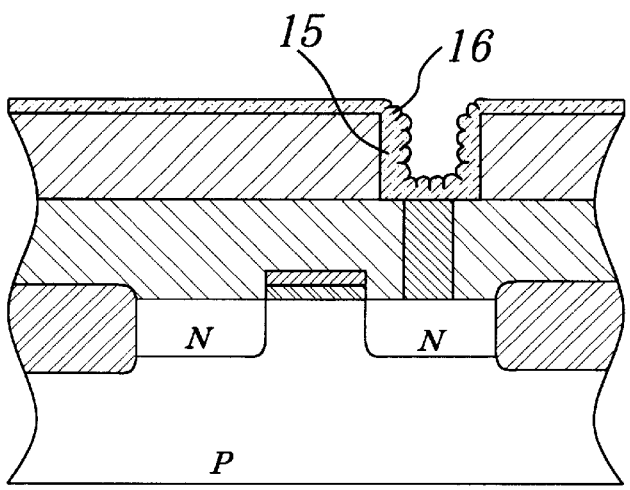

To guard against this, as shown in FIG. 11C, for example, a hydrofluoric acid (HF) solution diluted with water ($H_2O$), so-called D (Diluted) HF solution is used as an etchant to immerse the silicon substrate 1 therein, thus removing the chemical oxide film 27. In this case, this etchant preferably has a component ratio of $HF:H_2O=(1:100)$ through $(1:400)$. As this etchant, such a solution is employed as having a selection ratio between a material of the HSG 16 or the lower electrode and the chemical oxide film 27.

Figure 3F:
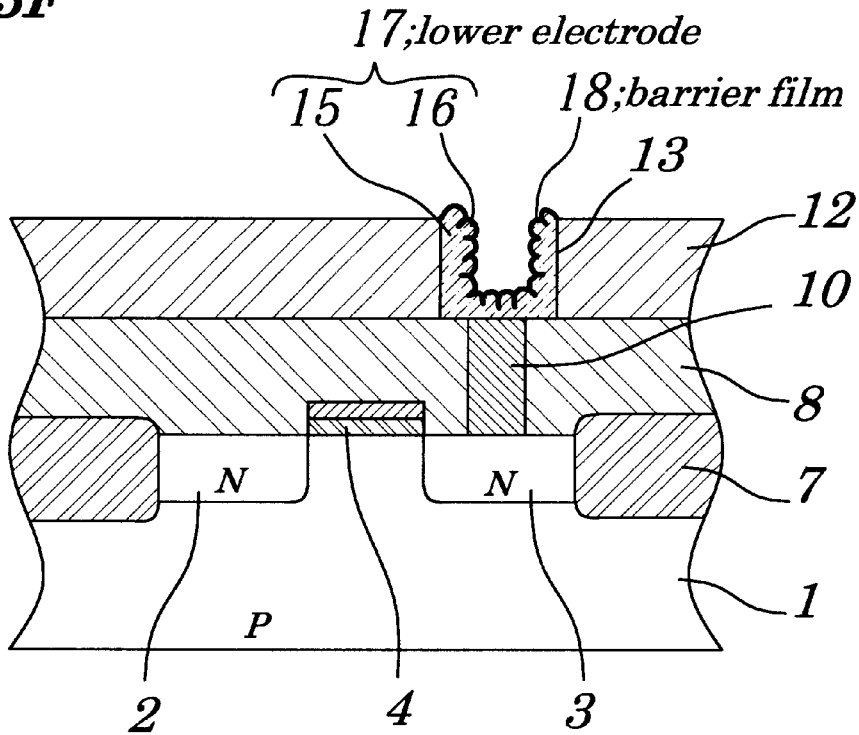

Next, as shown in FIG. 3F, the silicon substrate 1 is exposed in an atmosphere of, for example, ammonia to undergo processing, so-called RTN (Rapid Thermal Nitridation) processing at 850–950° C. for about one minute, thus forming a 1–2-nm thick barrier film 18 made of a silicon nitride film on the surface of the HSG 16 (step S15). This barrier film prevents the impurity already diffused into the lower electrode 17 from being diffused to outside.

Figure 4G:
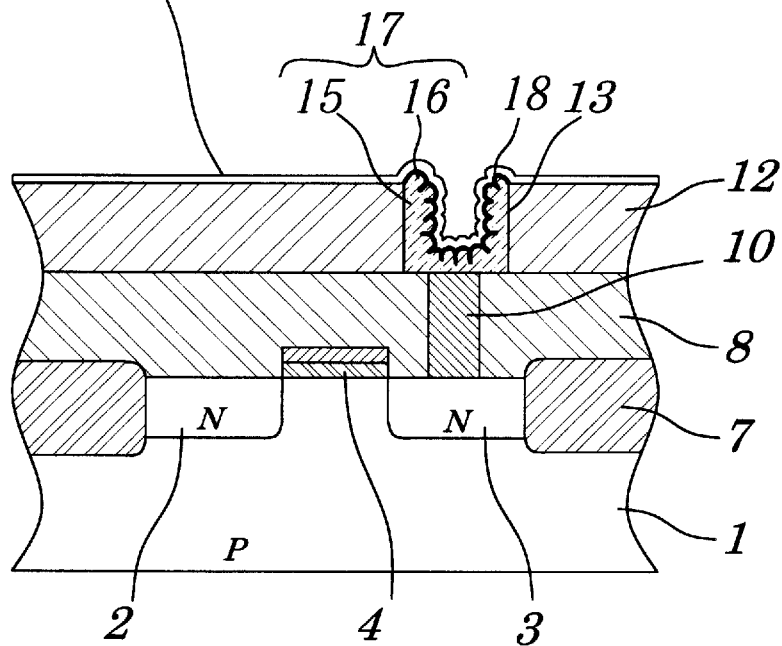
FIGS. 4G and 4H are further continued flow diagrams indicating the same method for manufacturing semiconductor memory devices as above, in the order of processes performed.

Next, as shown in FIG. 4G, the CVD method is used to form a silicon nitride film 19 as the capacitive insulator film 19 to a thickness of 6–7 nm (step S16). Next, for example, to reduce leakage current and initial failure rate due to being a capacitive element, the silicon substrate 1 is put into the furnace containing therein moisture diluted with nitrogen to undergo oxidation at 700–780° C. for 30–50 minutes (step S17). With this, on a boundary between the barrier film 18 and the capacitive insulator film 19 is formed a silicon oxide film (not shown) with a thickness of about 1 nm or less, which contributes to the reduction of the leakage current and the initial failure rate due to being a capacitive element.

Figure 4H:
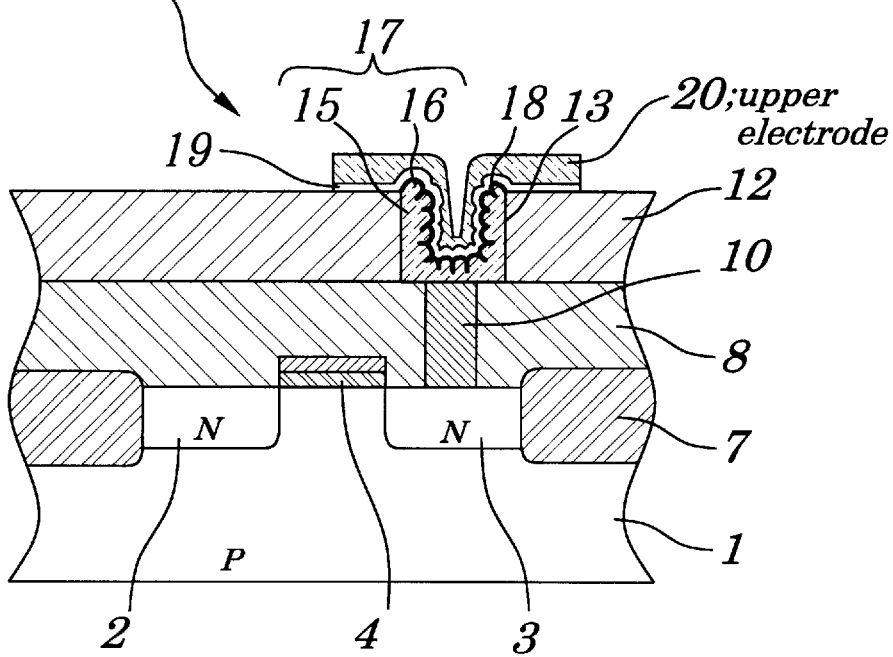
Figure 14:
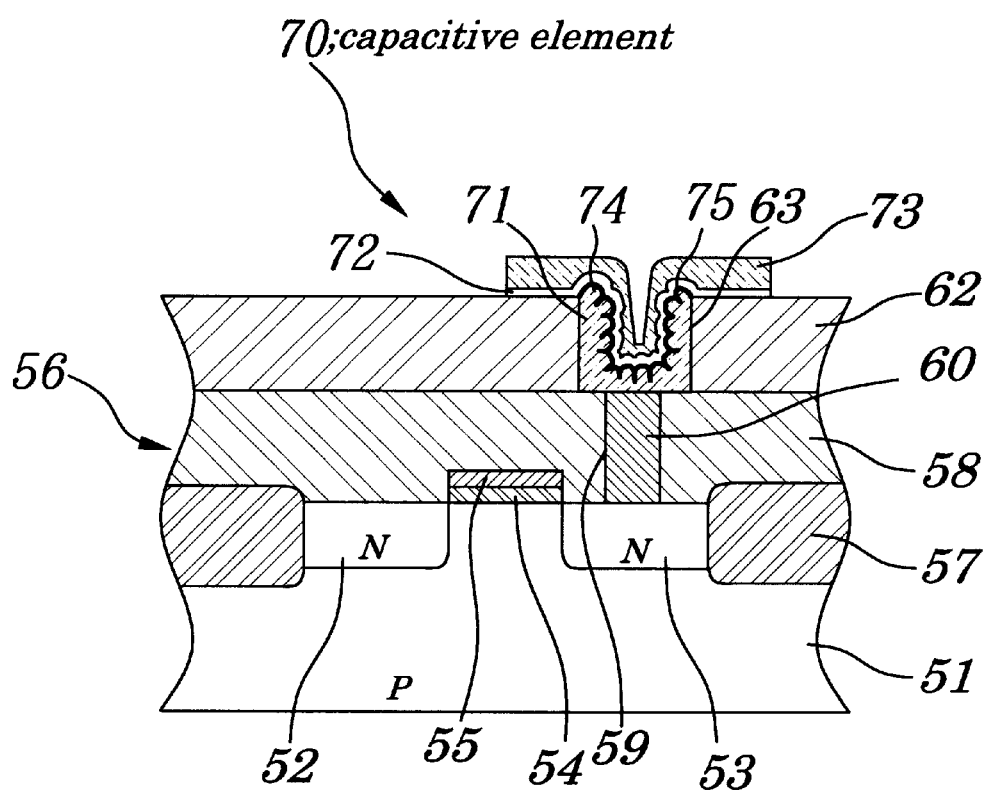
FIG. 14 is a cross-sectional view indicating a structure of a prior-art semiconductor device.

Next, as shown in FIG. 4H, the CVD method or the like is used to dope an impurity such as phosphorus into the whole surface, in order to form a conductive film such as a poly-silicon film and then to pattern this conductive film into a desired shape, thus forming an upper electrode 20 (step S18). With this, a capacitive element 21 is completed which has the lower electrode 17, the capacitive insulator film 19, and the upper electrode 20, corresponding to a structure of FIG. 14. This capacitive element 21 is connected to the N-type drain region 3 of the N-type MOS transistor 6 consisting of a memory-cell selecting transistor, thus constituting one 1-bit memory cell.

Figure 7:
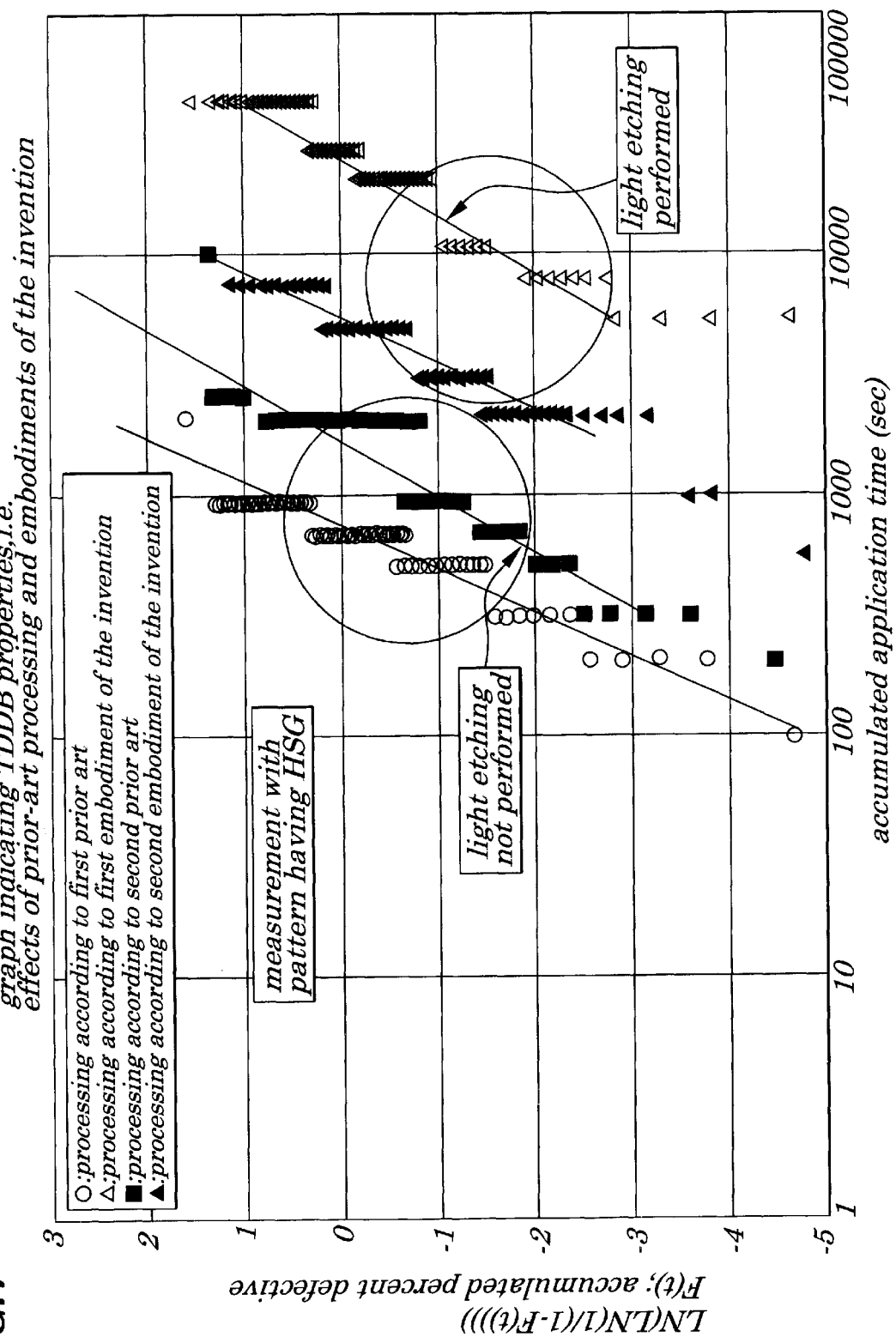
FIG. 7 is a graph indicating a relationship between an accumulated percent defective (vertical axis) and an accumulated application time lapse (horizontal axis) explaining a difference in a reliability of a capacitive element of a semiconductor memory device caused by light etching being performed/not performed after annealing of phosphine, obtained by the same method for manufacturing semiconductor memory devices as above.

The property graph of FIG. 7 explains a difference in reliability of the capacitive element of a semiconductor memory device caused by light; etching being performed/not performed after phosphine annealing. In the FIG. 7 the mark ○ indicates a prior-art manufacturing method performing the processes of HSG formation, phosphine annealing, RTN, and capacitive insulator film formation in this order and the mark ■ indicates another prior-art manufacturing method performing the processes of HSG formation, RTN, and capacitive insulator film formation in this order.

As can be seen from the FIG. 7 this property graph indicates that by performing light etching after phosphine annealing, the lower part of the HSG can be rounded off, thus improving the service life-of the capacitive element.

Figure 8:
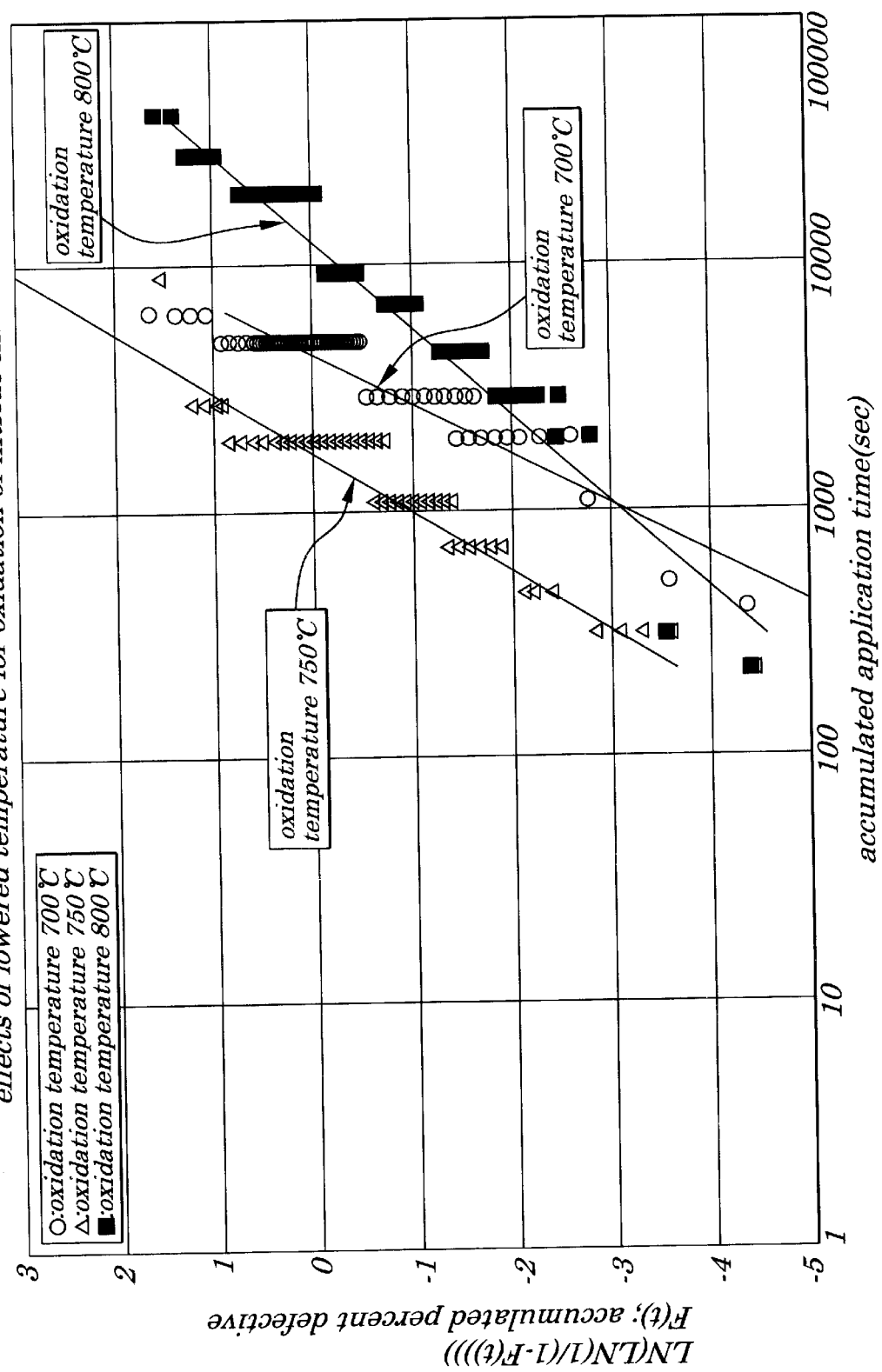
FIG. 8 is a graph indicating a relationship between an accumulated percent defective (vertical axis) and an accumulated application time lapse (horizontal axis) explaining a difference in initial failure rate caused by a difference in a temperature of oxidation after a capacitive insulator film is formed, obtained by the same method for manufacturing semiconductor memory devices as above.

A property graph of FIG. 8 explains a difference in an initial failure rate of the capacitive element of the semiconductor memory device caused by a difference in the temperature of oxidation performed after the capacitive insulator film is formed. As can be seen from the FIG. 8 the lower the oxidation temperature after capacitive insulator film formation, steeper become property lines, thus indicating improvements in the initial failure rate of the capacitive element. Also, as can be seen from the FIG. 8 this exemplified property graph as a whole indicates steep inclinations of the property lines, each of which proves improvements in the initial failure rate of the capacitive element. One reason for this may be that as the oxidation temperature is lowered, thermal stress is suppressed, to mitigate its influences.

Figure 9:
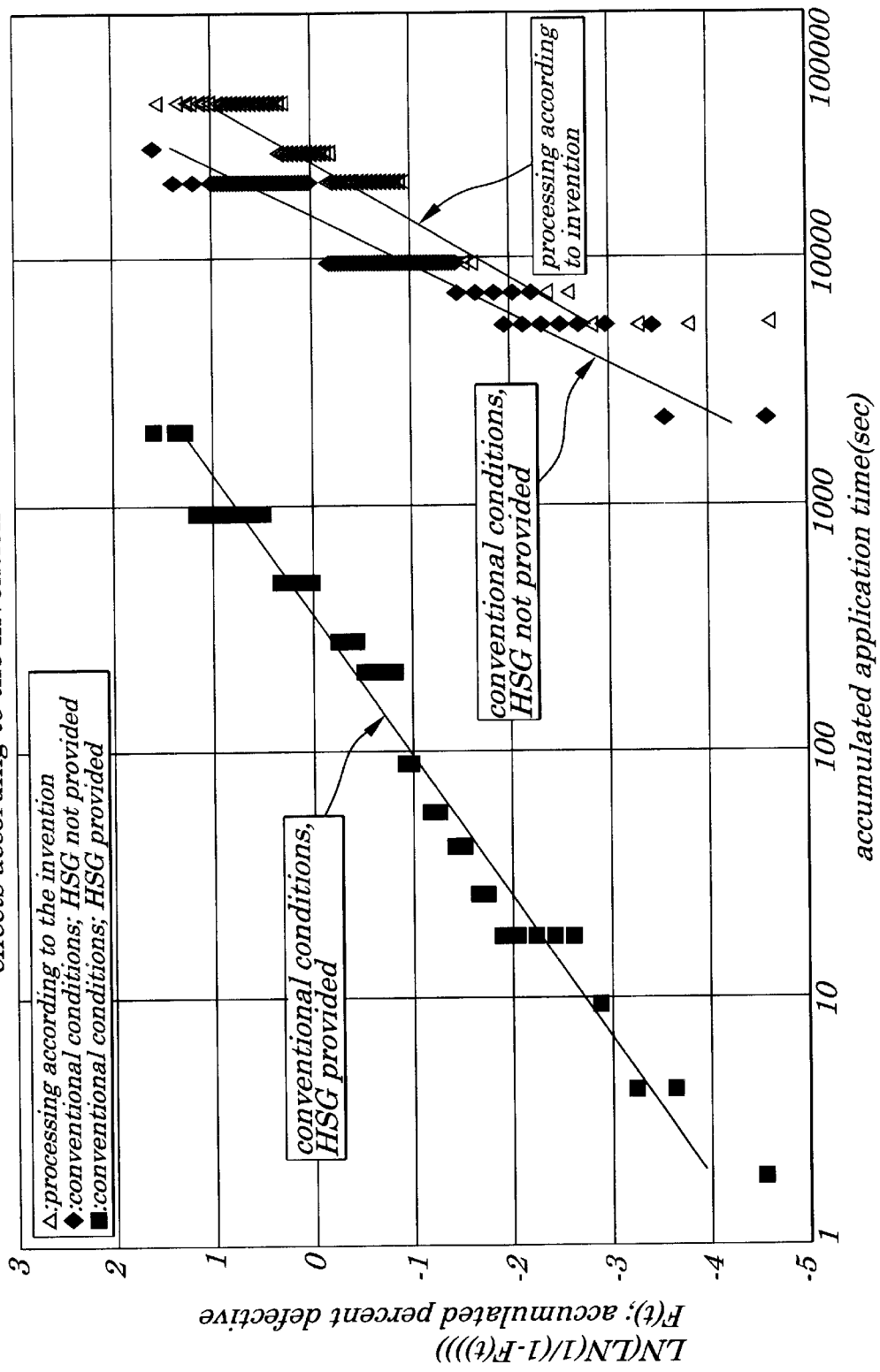
FIG. 9 is a graph indicating a relationship between an accumulated percent defective (vertical axis) and an accumulated application time lapse (horizontal axis) explaining that even a capacitive element with an HSG formed thereon can have almost a same improved service life as that without an HSG formed thereon, obtained by the same method for manufacturing semiconductor memory devices as above.

A property graph of FIG. 9 indicates that according to the invention, even a capacitive element with an HSG formed thereon can enjoy improvements in service life almost equal to that without an HSG formed thereon.

That is, as can be seen from FIG. 7 and FIG. 8, improvements in the service life and the initial failure rate of a capacitive element lead to improvements in its reliability, thus providing almost same improvements in the service life of such a capacitive element that has an HSG formed thereon as those for a capacitive element without an HSG formed thereon.

Thus, according to the configuration of this embodiment, for example, after forming the N-type MOS transistor 6 is formed beforehand as a memory-cell selecting transistor in the P-type silicon substrate 1, by, during the process of manufacturing the capacitive element 21, diffusing an impurity into-HSG formed beforehand and then removing the surface layer of the HSG, the constriction of the HSG can be rounded off, to inhibit the concentration of an electric field, thus improving the service life of the capacitive element and also suppressing depletion.

Also, by performing oxidation after capacitive insulator film formation in a wet-oxidation atmosphere inside a furnace at a relative low temperature of 700–780° C. for a relatively long time lapse of 30–50 minutes, mitigated stress is applied to the capacitive insulator film formed at the HSG constriction, thus reducing leakage current.

With this, the capacitive element having the HSG structure can be improved in service life and initial failure rate, to improve its reliability.

Second Embodiment

Figure 5:
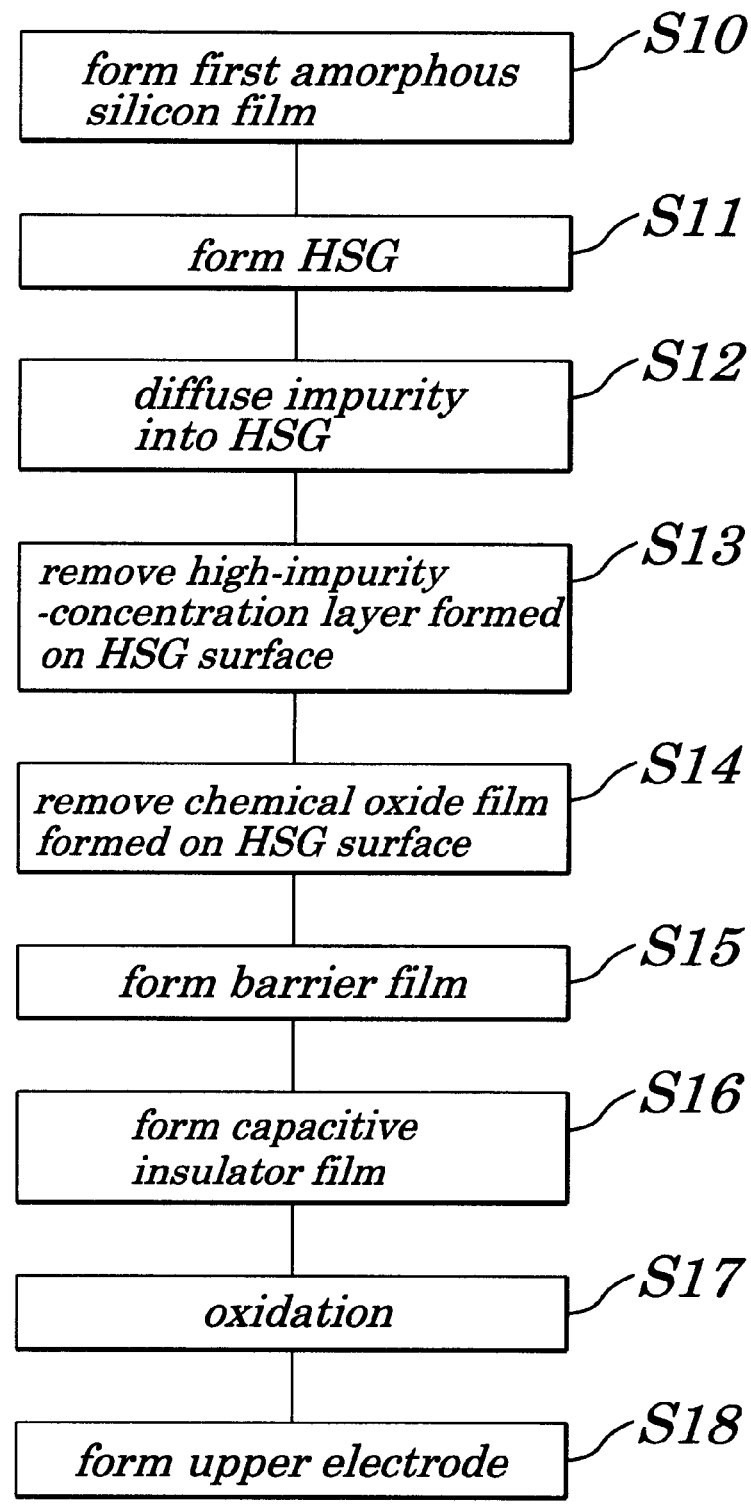
FIG. 5 is a flowchart indicating main processes of the same method for manufacturing semiconductor memory devices as above.

A method for manufacturing semiconductor memory devices according to a second embodiment largely differs from that of the above-mentioned first embodiment in a respect that, as shown in a flowchart of FIG. 5, immediately after an HSG is formed (step S11), its surface is cleared of a high-impurity-concentration layer (step S13).

That is, according to this embodiment, immediately after the HSG is formed, without diffusing an impurity into the HSG by rendering phosphine annealing useless, an HSG surface is subjected to light etching to remove its high-impurity-concentration regions. This embodiment also makes it possible to round off a shape of a lower part of the HSG as shown in a property graph of FIG. 7, thus improving service life of a capacitive element. Other processes are almost same as those of the above-mentioned first embodiment and so their explanation is omitted here.

Thus, this embodiment also can provide almost same effects as those mentioned above with respect to the first embodiment.

In addition, this embodiment can eliminate some of processes, thus decreasing number of processes required.

It is apparent that the present invention is not limited to the above embodiments but may be changed and modified without departing from the scope and spirit of the invention. For example, although a series of processes from HSG nucleation to impurity diffusion has been described with reference to the embodiment for performing them in a same reactive furnace, that is, an in-situ approach, the processes are not limited to it but an impurity diffusion process by use of a phosphine gas may be performed in another reactive furnace. Such approach can prevent adverse effects by phosphine deposited inside of a reactive furnace, which is liable to occur with the in-situ approach. That is, such a modification can prevent adverse effects on formation of the HSG by phosphine deposited on, for example, walls of the reactive furnace by a same processing performed repeatedly in the same reactive furnace according to the in-situ approach.

Also, a memory-cell selecting transistor, which is connected with a capacitive element to make up a memory cell, is not limited to an N-type MOS transistor but may come in a P-type MOS transistor. Further also, in formation of a lower electrode of an HSG structure, a silicon compound used for nucleation of the HSG is not limited to a silane gas but may come in di-silane, or any other appropriate materials. Further also, a phosphorus compound gas used for diffusing phosphorus into the HSG is not limited to phosphine but may come in any other appropriate materials containing phosphorus. Further also, a diffusion impurity is not limited to phosphorus. Further also, an inter-layer insulator film is not limited to a silicon oxide film but may come in a BSG (Boron Silicate Glass) film, a PSG (Phospho Silicate Glass) film, a BPSG (Boro Phospho Silicate Glass) film, or any other appropriate insulator film. Further also, the inter-layer insulator film, which has been described in the embodiment for forming first and second inter-layer insulator films though, may be formed as a third and subsequent inter-layer insulator films.

Further also, a gate oxide film is not limited to an oxide film but may come in a nitride film or even a double-configuration film consisting of an oxide film and nitride film. That is, a transistor used in the invention is not limited to a MOS transistor but may be a MNS (Metal Nitride Semiconductor) transistor, a MNOS (Metal Nitride Oxide Semiconductor) transistor as long as it is a MIS (Metal Insulator Semiconductor) transistor. Also, a conductivity type of a semiconductor substrate or semiconductor regions used in the invention may be reversed between P and N types. Further also, although material type, film thickness, concentration, and film forming method of insulator films, conductive films, and impurities have been described in only one example, they may be changed according to objects and applications.

Finally, the present application claims the Convention Priority based on Japanese Patent Application No. Hei 11-257881 filed on Sep. 10, 1999, which is herein incorporated by reference.

What is claimed is:

1. A method for manufacturing semiconductor memory devices having a memory-cell selecting transistor and a capacitive element, which is connected to one operating region of the memory-cell selecting transistor, comprising:

forming the memory-cell selecting transistor on the semiconductor substrate;

forming a first inter-layer insulator film having at least one contact hole with a conductive plug and covering the memory-cell selecting transistor and the semiconductor substrate;

forming a second inter-layer insulator film having a contact hole overlying the at least one contact hole with a conductive plug of the first inter-layer insulator film;

forming a lower electrode of the capacitive element that is electrically connected to the one operating region of the memory-cell selecting transistor, wherein a process of forming the lower electrode includes:

forming a first amorphous silicon film in the contact hole of the second inter-layer insulator film;

forming a second amorphous silicon film containing microcrystal above the first amorphous silicon film, to form a hemispherical grain (HSG) by using as a nucleus the microcrystal contained in the second amorphous silicon film;

diffusing an impurity into the HSG;

removing a surface layer of the HSG; and removing a chemical oxide film formed on a HSG surface;

forming a capacitive insulator film of the capacitive element above the lower electrode; and forming an upper electrode of the capacitive element above the capacitive insulator film.

2. The method for manufacturing semiconductor memory devices according to claim 1, wherein diffusing the impurity into the HSG comprises introducing the impurity into a reactive apparatus having a stable temperature to perform annealing for a predetermined time, and then, while continuing the introduction of the impurity, gradually lowering the temperature of the reactive apparatus.

3. The method for manufacturing semiconductor memory devices according to claim 2, wherein the impurity diffused into the HSG is phosphorus contained in a phosphine ($PH_3$) gas that is introduced into the reactive apparatus having a stable temperature of about 500° C. to about 780° C. at a pressure of about 5 Torr to about 400 Torr.

4. The method for manufacturing semiconductor memory devices according to claim 1, wherein removing a chemical oxide film formed on the HSG surface involves using an etchant having a selection ratio between a material of the HSG or the lower electrode and the chemical oxide film.

5. The method for manufacturing semiconductor memory devices according to claim 1, further comprising:

after forming the capacitative insulator film, oxidizing the semiconductor substrate in a furnace at a temperature of about 700° C. to about 780° C. for about 30 to about 50 minutes.

6. A method for manufacturing semiconductor memory devices having a memory-cell selecting transistor and a capacitive element, which is connected to one operating region of the memory-cell selecting transistor, comprising:

forming the memory-cell selecting transistor on the semiconductor substrate;

forming a first inter-layer insulator film having at least one contact hole with a conductive plug and covering the memory-cell selecting transistor and the semiconductor substrate;

forming a second inter-layer insulator film having a contact hole overlying the at least one contact hole with a conductive plug of the first inter-layer insulator film;

forming a lower electrode of the capacitive element that is electrically connected to the one operating region of the memory-cell selecting transistor, wherein a process of forming the lower electrode includes:

forming a first amorphous silicon film in the contact hole of the second inter-layer insulator film;

forming a second amorphous silicon film containing microcrystal above the first amorphous silicon film, to form a hemispherical grain (HSG) by using as a nucleus the microcrystal contained in the second amorphous silicon film;

diffusing an impurity into the HSG, wherein the impurity is introduced into a reactive apparatus having a stable temperature, to perform annealing for a predetermined time, and then, while continuing the introduction of the impurity, gradually lowering the temperature of the reactive apparatus;

removing a surface layer of the HSG:

forming a capacitive insulator film of the capacitive element above the lower electrode; and forming an upper electrode of the capacitive element above the capacitive insulator film.

7. The method for manufacturing semiconductor memory devices according to claim 6, wherein the impurity diff-used into the HSG is phosphorus contained in a phosphine ($PH_3$) gas that is introduced into the reactive apparatus having a stable temperature of about 500° C. to about 780° C. at a pressure of about 5 Torr to about 400 Torr.

8. The method for manufacturing semiconductor memory devices according to claim 6, wherein removing a chemical oxide film formed on the HSG surface involves using an etchant having a selection ratio between a material of the HSG or the lower electrode and the chemical oxide film.

9. The method for manufacturing semiconductor memory devices according to claim 6, further comprising:

after forming the capacitative insulator film, oxidizing the semiconductor substrate in a furnace at a temperature of about 700° C. to about 780° C. for about 30 to about 50 minutes.

* * * * *